(12) United States Patent
Hu et al.

(10) Patent No.: US 9,571,096 B2
(45) Date of Patent: Feb. 14, 2017

(54) TOUCH PANEL BASED SWITCH

(71) Applicant: Touchplus Information Corp., New Taipei (TW)

(72) Inventors: Shih Hsien Hu, New Taipei (TW); Yung Chang Lin, New Taipei (TW); Wey Chung Wang, New Taipei (TW)

(73) Assignee: TOUCHPLUS INFORMATION CORP., New Taipei (TW)

( * ) Notice: Subject to any disclaimer, the term of this patent is extended or adjusted under 35 U.S.C. 154(b) by 406 days.

(21) Appl. No.: 14/051,862

(22) Filed: Oct. 11, 2013

(65) Prior Publication Data

US 2014/0102873 A1    Apr. 17, 2014

(30) Foreign Application Priority Data

Oct. 11, 2012   (TW) .............................. 101137497 A

(51) Int. Cl.
*G06F 3/041* (2006.01)
*H03K 17/96* (2006.01)
*H03K 17/98* (2006.01)

(52) U.S. Cl.
CPC .......... *H03K 17/9622* (2013.01); *H03K 17/98* (2013.01); *H03K 2017/9602* (2013.01); *H03K 2217/96062* (2013.01)

(58) Field of Classification Search
CPC ................ H03K 17/9622; H03K 17/98; H03K 2017/9602; H03K 2217/96062
See application file for complete search history.

(56) References Cited

U.S. PATENT DOCUMENTS

| 2006/0158041 | A1* | 7/2006 | Caldwell ................ A47B 57/00 307/116 |
| 2007/0252729 | A1* | 11/2007 | Li ........................... G06F 3/0213 341/22 |
| 2011/0037624 | A1* | 2/2011 | Pance ..................... G06F 3/044 341/33 |
| 2011/0175671 | A1* | 7/2011 | Reynolds ............. H03K 17/962 327/517 |

\* cited by examiner

*Primary Examiner* — Kumar Patel
*Assistant Examiner* — Insa Sadio
(74) *Attorney, Agent, or Firm* — Muncy, Geissler, Olds & Lowe, P.C.

(57) ABSTRACT

A touch panel-based switch includes a control circuit layer, a sensing layer, a dielectric layer, and a touch operation layer, stacked in the order. The sensing layer electrically connected to the control circuit layer includes plural sensing cell, and the dielectric layer is flexible. The touch operation layer is flexible as well and includes a button area and an adjacent non-button area. The button area includes a ground plane stacked on the dielectric layer and a first touch cover stacked on the ground plane, and the non-button area includes a second touch cover stacked on the dielectric layer. Plural though openings are provided in the button area corresponding to the sensing cells such that a portion of the dielectric layer is exposed.

17 Claims, 8 Drawing Sheets

TOUCH PANEL BASED SWITCH

FIELD OF THE INVENTION

The invention is relevant to a switch, especially to a capacitive touch switch which includes a capacitive touch panel.

DESCRIPTION OF THE PRIOR ART

At present, switch device has very wide range of application, and is often used to perform a control over power supply in buildings as electricity power switches and over actuation and function selection for electronic appliance such as induction cooker, oven, and washing machine. Mechanical switch is one kind of conventional switch device, and in such switch device a metal plate spring is used to allow for turning on of lamps by means of selectively making contacts closed, and a potentiometer is used as a control means to allow for adjustment of illumination, as shown in FIG. 1. The switch design above is provided with a direct contact switch component 91 and has disadvantage such as reliability concern on contacts and control means and unattractive appearance (old fashion on ID design) and thus difficulty in fitting into the environment.

As such, another kind of conventional switch device which is categorized into non-contact switch is proposed in the field such as capacitive touch switch as shown in FIG. 2. The capacitive touch switch utilizes a currently hot technique of touch sensor 92, a control circuit 93 and a dimmer 94 to attain the control of appliance such as a lamp 95.

The touch switch above is turned on based on capacitive sensing principle that a capacitance in a sensing area is changed in response to finger touching on the area so that an electrical processing procedure is run to turn on the switch. Such switch is simple in its design and easy to match or fit to any application environment, and further features high reliability and feeling of high technology and fashion. However, it is readily found that such switch still has disadvantage such as low noise immunity, inconvenience in operation in the dark or the like. Moreover, it lacks tactile feel as those mechanical switch when a user perform an action of turn-on/turn-off or adjustment.

SUMMARY OF THE INVENTION

One objective of the present invention is to provide a touch panel based switch for turn on/turn off and/or adjustment of electronic appliance.

Another objective of the present invention is to provide a tactile feel to users when depressing a switch equipped with a capacitive touch panel.

To achieve the objectives above and others, a touch panel based switch of the invention comprises a control circuit layer, a sensing layer, a dielectric layer, and a touch operation layer, all of which are stacked sequentially from bottom to top. The sensing layer is electrically connected to the control circuit layer and includes plural sensing cells.

The dielectric layer and the touch operation layer are flexible and the latter includes a button area and a non-button area adjacent to the button area where the button area includes a ground plane stacked on the dielectric layer and a first touch cover stacked on the ground plane, and the non-button area includes a second touch cover stacked on the dielectric layer.

The button area is provided with plural openings for exposing a portion of the dielectric layer and the openings are configured to correspond to the sensing cells.

Through the switch design of the present invention, it provides not only a perfect fitting into any environment but also a depressing tactile feel as a mechanical switch.

The present invention also has merits in that a proximity detection function can be offered, for example, a response to detection may be lighting for indication or ambient light.

The touch operation layer may further include a proximity ring surrounding the button area and the non-button area and being electrically connected to the control circuit layer so that it is controlled by the control circuit layer to provide proximity detection.

The control circuit layer and the sensing layer may be integral into a single multi-layered PCB and the control circuit layer includes a shield for interfacing with the sensing layer.

The switch of the present invention may further include an LED matrix having plural LED units accommodated in through slots extending through the sensing layer along with the shield.

Each of the LED units may include three emitting colors such as red, blue, and green colors.

The sensing cells may be any shape as desired such as square. The sensing cells may also be hexagonal to form a pattern of honeycomb altogether.

Within an area defined by the same sensing cell, the LED module and the opening are arranged in staggered way.

The dielectric layer may be made of rubber material.

The switch may further include a printed pattern for operation indication, wherein the printed pattern may be disposed at the touch operation layer.

BRIEF DESCRIPTION OF THE DRAWINGS

The primitive objectives and advantages of the present invention will become apparent upon reading the following description and upon reference to the accompanying drawings in which.

DESCRIPTION OF THE PREFERRED EMBODIMENT

In order to fully understand the manner in which the above-recited details and other advantages and objects according to the invention are obtained, a more detailed description of the invention will be rendered by reference to the best-contemplated mode and specific embodiments thereof. The following description of the invention is made for the purpose of illustrating the general principles of the invention and should not be taken in a limiting sense; it is intended to illustrate various embodiments of the invention. As such, the specific modifications discussed are not to be construed as limitations on the scope of the invention. It will be apparent to one skilled in the art that various equivalents, changes, and modifications may be made without departing from the scope of the invention, and it is understood that such equivalent embodiments are to be included herein. The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section. Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Preferred embodiments and aspects of the invention will be described to explain the scope, structures and procedures of the invention. In addition to the preferred embodiments of the specification, the present invention can be widely applied in other embodiments.

Figure 1:
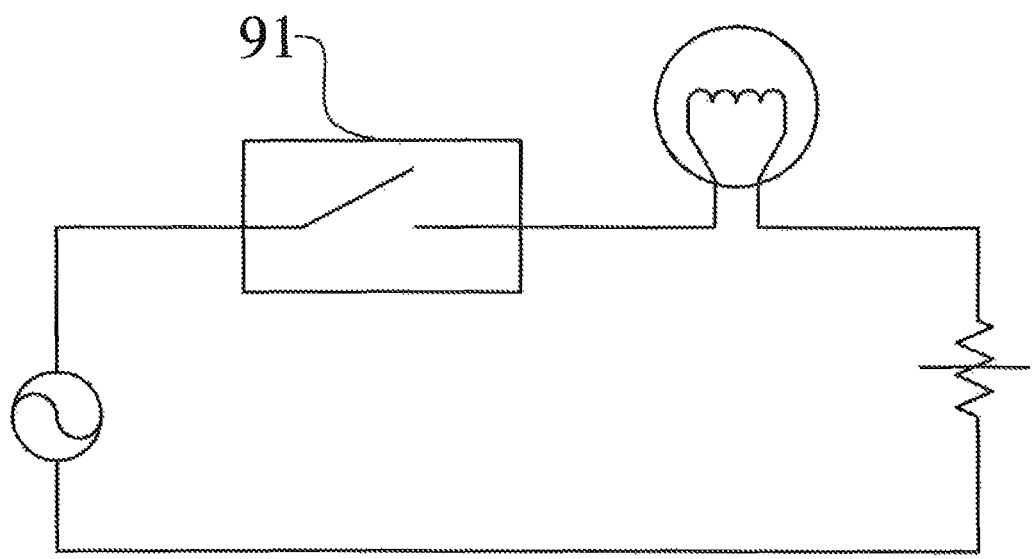
FIG. 1 is a circuit diagram of a conventional mechanical switch.
Figure 2:
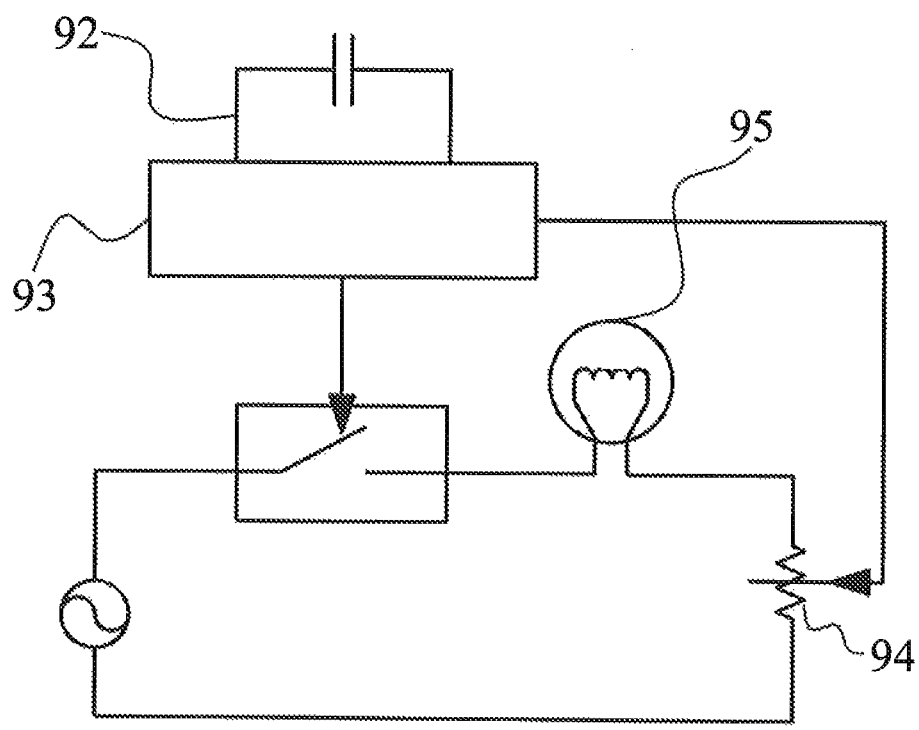
FIG. 2 is a circuit diagram of a conventional capacitive touch switch.
Figure 3:
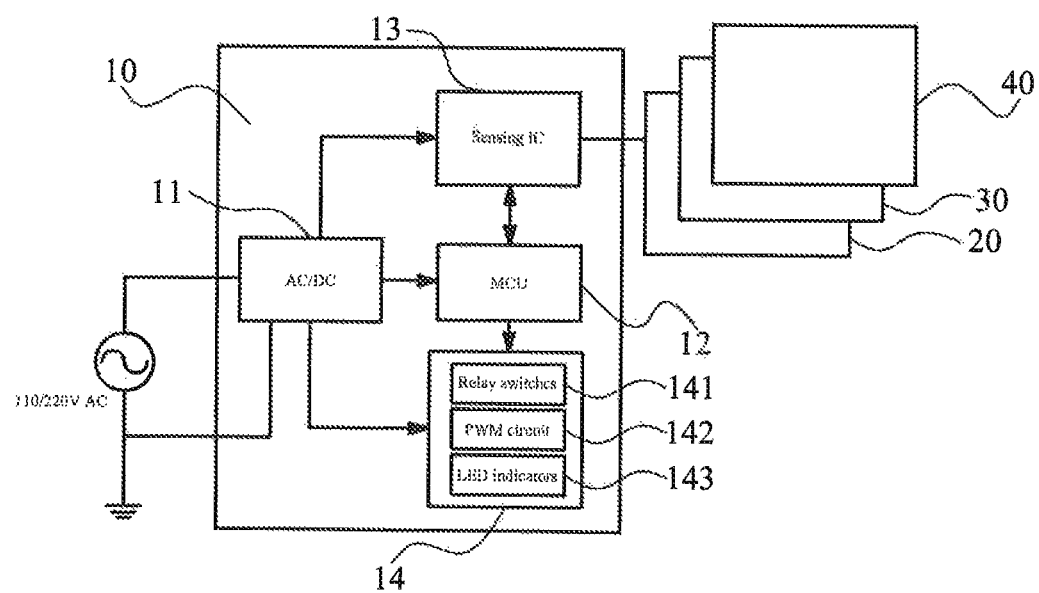
FIG. 3 is a system diagram of a touch panel based switch according to a first embodiment of the present invention.
Figure 4:
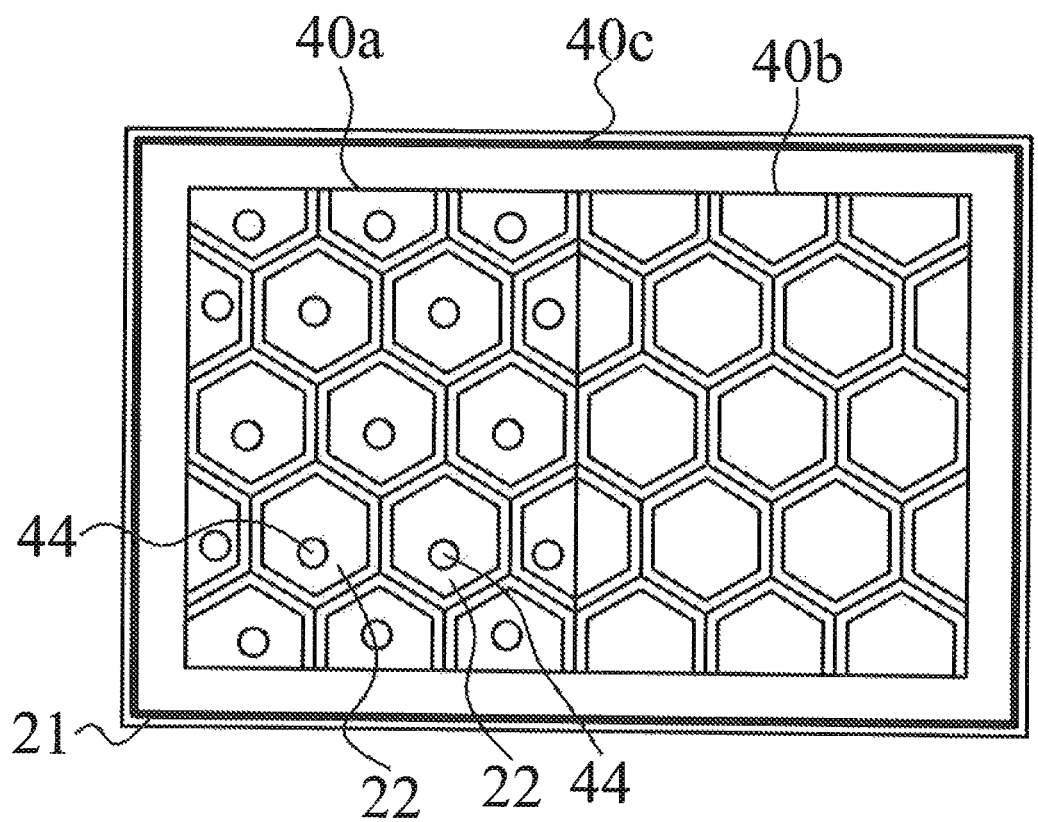
FIG. 4 shows arrangement of the sensing layer with respect to the touch operation layer in FIG. 3 from a top view.
Figure 5:
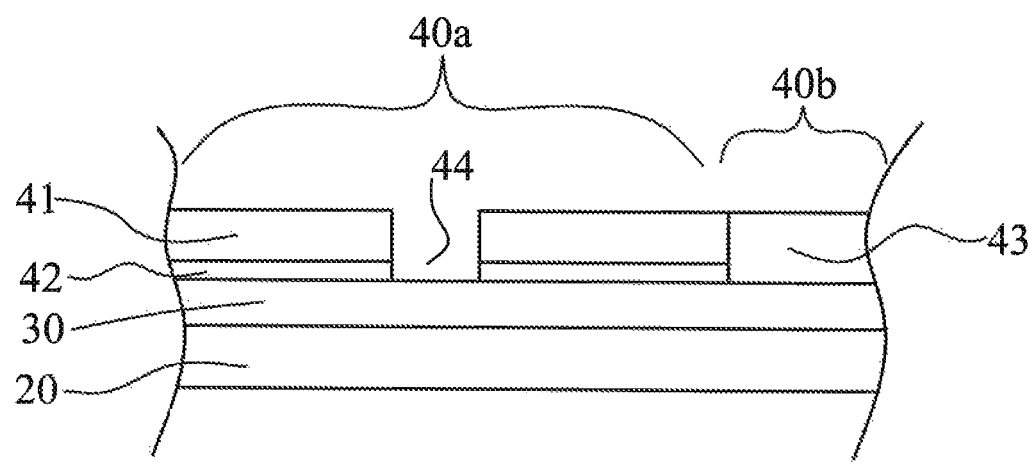
FIG. 5 is a partial cross sectional view of the touch panel based switch according to the first embodiment of the present invention.

Referring to FIGS. 3 to 5, a system diagram of a touch panel based switch according to a first embodiment of the present invention, arrangement of the sensing layer with respect to the touch operation layer in FIG. 3 from a top view, and a partial cross sectional view of the touch panel based switch according to the first embodiment of the present invention, respectively; this example shows that a touch panel based switch mainly includes a control circuit layer 10, a sensing layer 20, a dielectric layer 30, and a touch operation layer 40, all of which are stacked in the order.

The control circuit layer 10 includes an AC-to-DC converter 11, a microcontroller unit (MCU) 12 coupled to the AC-to-DC converter 11, a sensing circuit 13 coupled to the microcontroller unit (MCU) 12, and a module 14 including relay switches 141, a pulse width modulation (PWM) circuit 142, and LED indicators 143. The module 14 is also coupled with the microcontroller unit (MCU) 12. Electricity is supplied by a power supply on wall (for supplying alternating current) to the AC-to-DC converter 11 of the control circuit layer 10 and then is converted into direct current delivered to the MCU 12, the sensing circuit 13, and the module 14. The MCU 12 governs functional action of the module 14 and has two-way communication with the sensing layer 13.

Briefly, the control circuit layer 10 has its input involve in supplied power and sensing signals and has its output involve in turn on/turn off of electronic appliance and indicators, PWM for stepping control, AC-to-DC conversion, capacitive touch signal detection, and gesture interpretation. The PWM refers to a commonly used technique for controlling power to inertial electrical devices, made practical by modern electronic power switches. Typically switchings have to be done several times a minute in an electric stove, 120 Hz in a lamp dimmer, tens or hundreds of kHz in audio amplifiers and computer power supplies. The AC-to-DC conversion refers to a technique or a device that changes between direct current (DC) and alternating current (AC). The converted AC can be at any required voltage and frequency with the use of appropriate transformers, switching, and control circuits.

The sensing layer 20 showed in the figure is a one dimensional and single-layered capacitive touch sensitive structure which is made mainly by forming plural sensing cells 22 on a rigid substrate 21 such as a PCB through techniques such as imprinting. Alternatively, the substrate may be of glass or PMMA. The flexible dielectric layer 30 is stacked on the sensing layer 20 and the touch operation layer 40 is further stacked on the dielectric layer 30 so that a sandwich structure, also a capacitor structure, is formed. For providing a depressing tactile feel from the switch to users, the dielectric layer 30 is preferably made of elastic material such as a rubber spacer. It is certain that material should be selected in consideration of not affecting operation of the capacitor structure.

Each of the sensing cells 22 of the sensing layer 20 is individually connected to the control circuit layer 10 as one plate of the capacitor structure, while the touch operation layer 40 serves as another plate of the capacitor structure.

Specifically, the flexible touch operation layer 40 is divided into two adjacent areas, button area 40a and non-button area 40b, and a proximity ring 40c surrounding two areas. The button area 40a includes a ground plane 42 stacked on the dielectric layer 30 and a first touch cover 41 stacked on the ground plane 42, and the non-button area 40b includes a second touch cover 43 stacked on the dielectric layer 30 but without ground plane. The ground plane 42 may be imprinted onto the first touch cover 41.

In addition, the button area 40a is provided with plural openings 44, each extending through the first touch cover 41 and the ground plane 42 to expose a portion of the dielectric layer 30. Particularly, each of the openings 44 is positioned to correspond to (aligning with) one of the sensing cells 22 of the sensing layer 20, for example, the opening 44 may be positioned at a center of the sensing cell 22. Within the button area 40a, capacitor structure for the region other than the openings 44 is constituted by ground plane/dielectric layer/sensing layer.

In the example, the individual sensing cell 22 is shaped to be regular hexagon so that all sensing cells constitute a honeycomb electrode pattern having advantage of optimal area usage and low cost. Material for the sensing cell includes but not limited to ITO, ATO, IZO, ZnO or the like.

When a user operates an electronic appliance through a switch by having his finger press on a region other than the opening 44 in the button area 40a to bend downwardly the ground plane 42, capacitance of the capacitor structure is changed due to varied clearance between the ground planed and sensing layer (also thickness of the dielectric layer) corresponding to pressing position. Therefore the control circuit layer is able to detect the variation and performs task predefined such as turning on/turning off an electronic appliance. Subject to appropriate selection of material for the touch operation later 40 and the dielectric layer 30, depressing action provides actors with a tactile feel, and this feature makes the present invention superior to conventional capacitive touch switch.

The button area of the touch operation layer 40 can also be used for gesture operation, which is fulfilled by provision of the openings 44. In other words, since there is no block of the ground plane at each opening for finger approaching, a coupling capacitance can be produced in conjunction with the sensing layer, the control circuit layer will surely detect movement of the finger and take an action according to predefined function.

The non-button area 40b is used as a gesture operation area. When a finger touches on the second touch cover 43, the finger along with the dielectric layer and the sensing layer constitute a capacitor structure altogether, and thus the movement of the finger within this area can also be detected by the control circuit layer which consequently takes an action according to predefined function.

Figure 8:
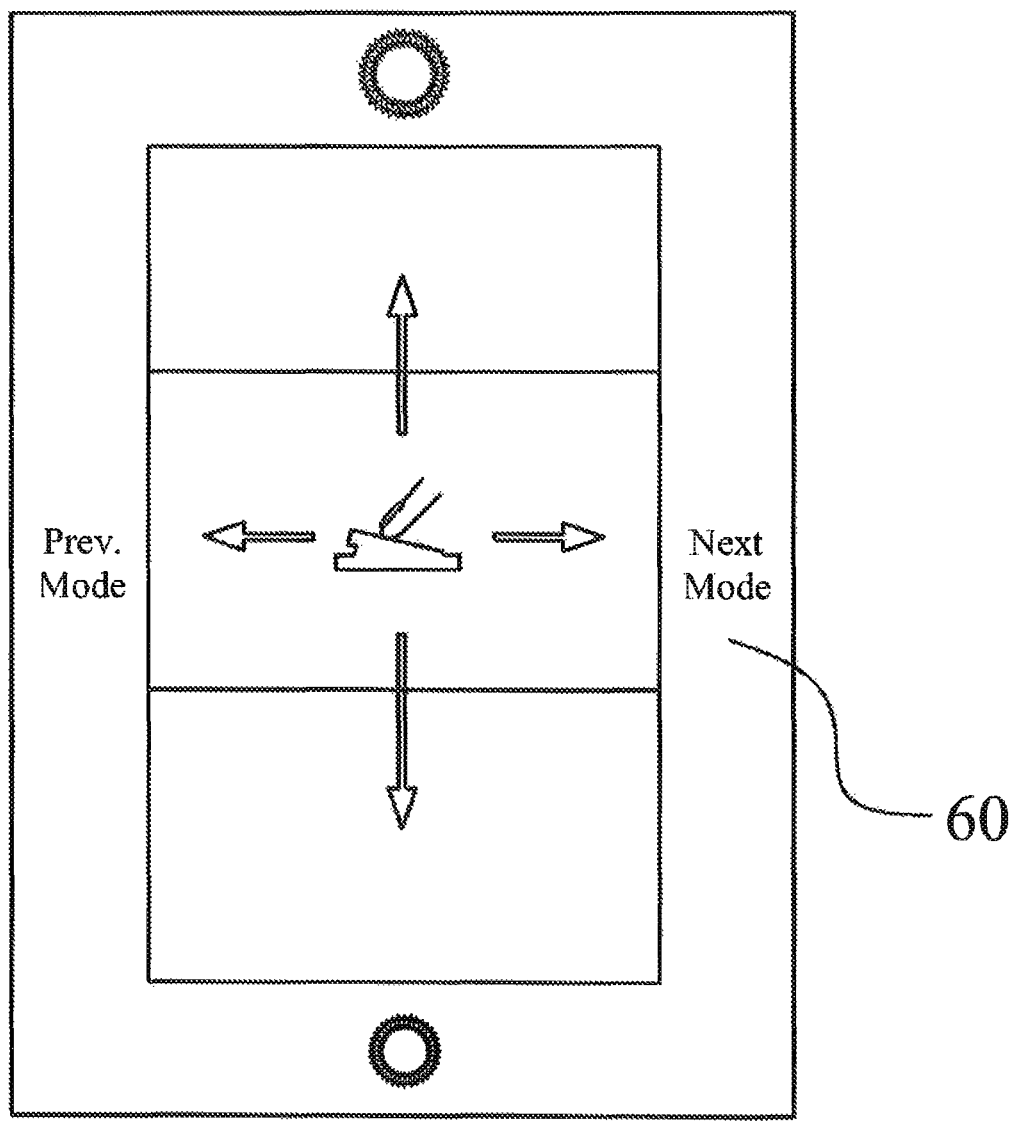
FIG. 8 shows exterior appearance of a touch panel based switch with pattern for operation indication.

One of examples of functional definition for gesture operation is: sliding up/down to turn higher/lower electronic appliance such as adjustment of illumination; slide left/right to switch to previous/next mode (if the appliance provides multi operation modes), as shown in FIG. 8. An operation information may further be offered to users by forming a printed pattern 60 at the touch operation layer 40 such as outer surface or other proper position in order to get familiar with the way of operating the appliance more easily.

The proximity ring 40c includes metal traces imprinted on the touch operation layer and connected to the control circuit layer 10 to serve as a sensing channel. When the finger approaches the switch device, say about 5-10 cm, change on capacitance related to the proximity ring 40c occurs, and the change can be detected by the control circuit layer 10 which consequently takes an action according to predefined function.

Given the above, the touch panel based switch of the present invention not only features its simple structure, but also has both advantages of depression tactile feel as mechanical switch and gesture operation as capacitive touch switch.

Figure 6:
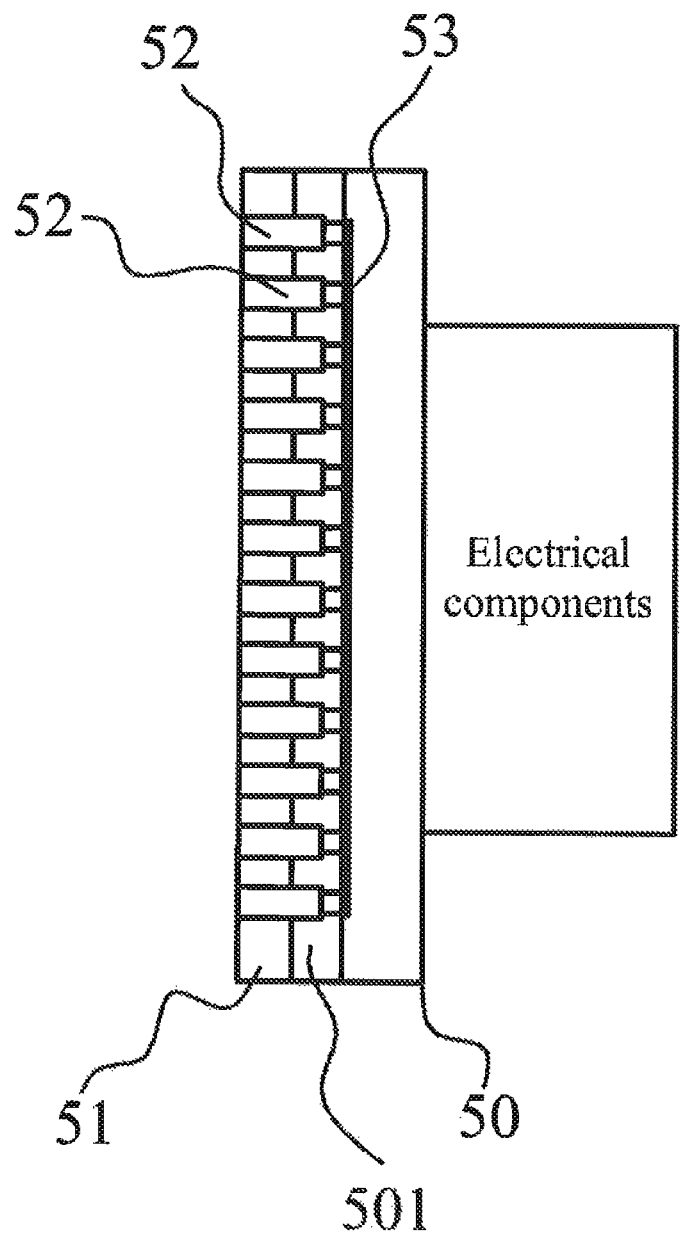
FIG. 6 is a partial cross sectional view of a touch panel based switch according to a second embodiment of the present invention.

Referring to FIG. 6, a partial cross sectional view of a touch panel based switch according to a second embodiment of the present invention; in the embodiment, the touch panel based switch has similar components to the previous one, except that a control circuit layer 50 and a sensing layer 51 are integrated into a multi-layered PCB, thereby miniaturizing the whole switch device and eliminating step of combining two layers and related cost. In this example, the control circuit layer 50 includes a shield 501 adapted to interface with the sensing layer 51 for purpose of keeping sensing signals clean from the sensing layer 51. Depending on complexity of the control circuit layer 50, the multi-layered PCB may be of 4-layered or 5-layered.

Further, plural slots 52 extend through the sensing cells of the sensing layer 51 and through the specific portion of the shield 51 which corresponds to the sensing cells above. An LED matrix 53 is accommodated in these slots 52 and electrically connected to and thus controlled by the control circuit layer 50. The slots 52 allow light from LED to emit out and be observed by people. For the reason, the touch operation layer and the dielectric layer should have sufficient transparency for LED light.

Figure 7:
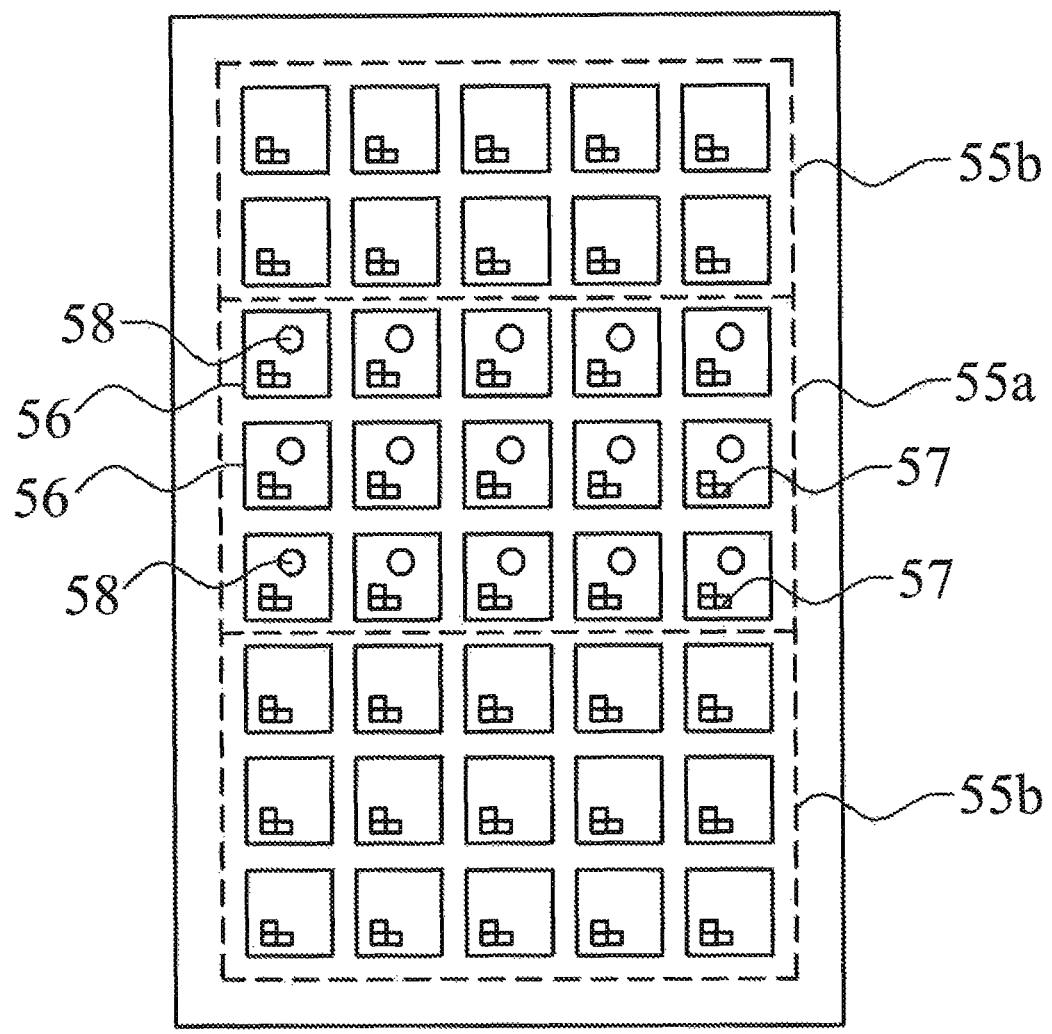
FIG. 7 is a schematic view of a touch panel based switch according to a third embodiment of the present invention.

Referring to FIG. 7, a schematic view of a touch panel based switch according to a third embodiment of the present invention; the embodiment places an emphasis on square sensing cells 56 of a switch device and better arrangement for LED compared with honeycomb version in the first embodiment. In the figure, an LED unit 57 within each of the sensing cells 56 includes three emitting colors (red, blue, and green), and individual LED units 57 have same disposition in a button area 55a (in the middle portion of the switch) and in non-button areas 55b (in two flank portions of the switch). The LED units 57 are deviated from openings 58 in the button area 55a and disposed at the border.

LED indicators can be turned on by depressing a region other than the openings in the button area (that is an action of turning on the appliance). However, LED indicators may be alternatively turned on by proximity detection by the proximity ring, which is the case that LED indicators supply sufficient illumination allowing a user to find the switch device he would operate, especially in dark environment, and that the user need not memorize or try hard to search for the switch device.

LED indicators may also be configured to have various exhibition modes for indication of different operation such as by different colors, different characters and/or symbols, rolling or blinking. Alternatively, LED indicators may be configured to serve as night light on the hallway.

It is certain that the sensing cells may be shaped to differentiate from those described in embodiments above according to any consideration.

The foregoing description, for purposes of explanation, was set forth in specific details of the preferred embodiments to provide a thorough understanding of the invention. However, it will be apparent to one skilled in the art that specific details are not required in order to practice the invention. Therefore, the foregoing descriptions of specific embodiments of the invention are presented for purposes of illustration and description only and should not be construed in any way to limit the scope of the invention. They are not intended to be exhaustive or to limit the invention to the precise forms disclosed; obviously, many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following Claims and their equivalents define the scope of the invention.

What is claimed is:

1. A touch panel based switch having a button area and a non-button area, and comprising:
   a control circuit layer;
   a sensing layer overlying and electrically connected to the control circuit layer and including plural sensing cells; and
   a dielectric layer overlying the sensing layer; and
   a touch operation layer overlying the dielectric layer and including a ground plane and a first touch cover in the button area, and including a second touch cover in the non-button area, wherein the ground plane overlies the dielectric layer which is flexible and deformable so that a clearance between the ground plane and the sensing layer is changeable in response to a user's pressing operation, and wherein the first touch cover overlies the ground plane and the second touch cover overlies the dielectric layer which is not covered by the ground plane,
   wherein the ground plane, the dielectric layer, and the sensing cells in the button area function for press sensing control, and the sensing cells in the non-button area function for touch or gesture-based sensing control.

2. The touch panel based switch of claim 1, wherein the ground plane is provided with plural openings to have the sensing cells in the button area partially uncovered from the ground plane for touch or gesture-based sensing control.

3. The touch panel based switch of claim 1, wherein the touch operation layer further comprises a proximity ring surrounding both an area for the press sensing control and an area for the touch or gesture-based sensing control and electrically connected to and thus being controlled by the control circuit layer for proximity detection.

4. The touch panel based switch of claim 1, wherein the control circuit layer and the sensing layer are integral into a single multi-layered PCB and the control circuit layer comprises a shield for interfacing with the sensing layer.

5. The touch panel based switch of claim 4, further comprising an LED matrix and wherein the sensing layer along with the shield are provided with plural through slots for accommodating plural LED units of the LED matrix.

6. The touch panel based switch of claim 5, wherein each of the LED units includes three emitting colors.

7. The touch panel based switch of claim 5, wherein each of the sensing cells is shaped to be square.

8. The touch panel based switch of claim 5, wherein the ground plane is provided with plural openings, and any of the LED units is arranged to be staggered with any of the openings.

9. The touch panel based switch of claim 1, wherein the dielectric layer is made of rubber material.

10. The touch panel based switch of claim 1, wherein the sensing cells form a pattern of honeycomb.

11. The touch panel based switch of claim 1, further comprising a printed pattern attached to the touch operation layer for operation information.

12. The touch panel based switch of claim 1, wherein a thickness of the dielectric layer is changed in response to the user's pressing operation so as to change the clearance between the ground plane and the sensing layer.

13. A touch panel based switch, having a button area and a non-button area, and comprising:
    a control circuit layer;
    a sensing layer overlying and electrically connected to the control circuit layer and including a plurality of sensing cells;
    a dielectric layer overlying the sensing layer and being flexible and deformable so that a clearance between the ground plane and the sensing cells is changeable in response to a user's pressing operation; and
    a ground plane overlying the dielectric layer and the sensing layer in the button area, while the dielectric layer and the sensing cells are uncovered from the ground plane in the non-button area,
    wherein the ground plane, the dielectric layer, and the first portion of the sensing cells in the button area function for press sensing control, and the sensing cells in the non-button area function for touch or gesture-based sensing control.

14. The touch panel based switch of claim 13, wherein the ground plane is provided with plural openings to have the sensing cells in the button area partially uncovered from the ground plane for touch or gesture-based sensing control.

15. The touch panel based switch of claim 14, further comprising plural LED units underlying the sensing layer, and any of the LED units is arranged to be staggered with any of the openings.

16. The touch panel based switch of claim 13, wherein the touch operation layer further comprises a proximity ring surrounding both an area for the press sensing control and an area for the touch or gesture-based sensing control and electrically connected to and thus being controlled by the control circuit layer for proximity detection.

17. The touch panel based switch of claim 13, wherein a thickness of the dielectric layer is changed in response to the user's pressing operation so as to change the clearance between the ground plane and the sensing layer.

* * * * *